United States Patent
Iwata et al.

(10) Patent No.: US 12,095,004 B2
(45) Date of Patent: Sep. 17, 2024

(54) POINT SOURCE LIGHT-EMITTING DIODE AND METHOD OF PRODUCING THE SAME

(71) Applicant: DOWA Electronics Materials Co., Ltd., Tokyo (JP)

(72) Inventors: Masatoshi Iwata, Akita (JP); Naruki Shindo, Akita (JP)

(73) Assignee: DOWA Electronics Materials Co., Ltd., Chiyoda-ku (JP)

( * ) Notice: Subject to any disclaimer, the term of this patent is extended or adjusted under 35 U.S.C. 154(b) by 413 days.

(21) Appl. No.: 17/754,266

(22) PCT Filed: Oct. 1, 2020

(86) PCT No.: PCT/JP2020/037477
§ 371 (c)(1),
(2) Date: Mar. 29, 2022

(87) PCT Pub. No.: WO2021/066116
PCT Pub. Date: Apr. 8, 2021

(65) Prior Publication Data
US 2022/0328717 A1     Oct. 13, 2022

(30) Foreign Application Priority Data
Oct. 2, 2019 (JP) .................... 2019-182352

(51) Int. Cl.
*H01L 33/00*    (2010.01)
*H01L 33/14*    (2010.01)
*H01L 33/38*    (2010.01)

(52) U.S. Cl.
CPC .......... *H01L 33/145* (2013.01); *H01L 33/005* (2013.01); *H01L 33/382* (2013.01)

(58) Field of Classification Search
CPC ... H01L 33/145; H01L 33/005; H01L 33/382; H01L 33/14; H01L 33/38; H01L 33/30
See application file for complete search history.

(56) References Cited

U.S. PATENT DOCUMENTS

2005/0014387 A1  1/2005 Tanaka et al.
2007/0153857 A1  7/2007 Chua et al.

FOREIGN PATENT DOCUMENTS

JP    S61166186 A    7/1986
JP    H1126810 A     1/1999
(Continued)

OTHER PUBLICATIONS

Apr. 5, 2022, International Preliminary Report on Patentability issued in the International Patent Application No. PCT/ JP2020/ 037477.
(Continued)

*Primary Examiner* — Elias Ullah
(74) *Attorney, Agent, or Firm* — KENJA IP LAW PC

(57) ABSTRACT

The point source light-emitting diode includes a substrate; an n-type cladding layer; a light emitting layer; a p-type cladding layer; an n-type current confinement layer; a p-type contact layer provided on the n-type current confinement layer; and a p-type electrode having a light emission window concentric with the opening. The window opening width of the light emission window is equal to or larger than an opening width of the opening. The point source light-emitting diode has a hydrogen ion implanted area extending from the p-type contact layer to the light emitting layer in the thickness direction. The light emitting layer has a non-implanted region that has a region width larger than the opening width of the light emission window and is concentric with the light emission window, and a hydrogen ion implanted region enclosing the non-implanted region.

6 Claims, 9 Drawing Sheets

(56) References Cited

FOREIGN PATENT DOCUMENTS

| JP | 2002111051 A | 4/2002 |
| JP | 2002124699 A | 4/2002 |
| JP | 2002280602 | 9/2002 |
| JP | 2015170717 A | 9/2015 |
| JP | 2016152259 A | 8/2016 |
| JP | 2017112292 A | 6/2017 |

OTHER PUBLICATIONS

Dec. 15, 2020, Notification of Reasons for Refusal issued by the Japan Patent Office in the corresponding Japanese Patent Application No. 2019-182352.
Dec. 22, 2020, International Search Report issued in the International Patent Application No. PCT/ JP2020/037477.
Jan. 29, 2021, Office Action issued by the Taiwan Intellectual Property Office in the corresponding Taiwanese Patent Application No. 109134461.
Jun. 29, 2021, Notification of Reasons for Refusal issued by the Japan Patent Office in the corresponding Japanese Patent Application No. 2019-182352.

POINT SOURCE LIGHT-EMITTING DIODE AND METHOD OF PRODUCING THE SAME

TECHNICAL FIELD

This disclosure relates to a point source light-emitting diode and a method of producing the same.

BACKGROUND

In recent years, light-emitting diodes (LEDs) are used in various applications depending on the wavelength of the light emitted therefrom, for example, sensors, gas analysis, vehicle mounted cameras, lightings, traffic lights, disinfection, and resin curing. When a light-emitting diode is used for use in a sensor light source of those applications, the point source light-emitting diode used emits light exhibiting a uniform emission intensity profile. While typical light-emitting diodes emit light in all directions from a light emitting region, light is extracted from a point source light-emitting diode only in a certain direction. Such a point source light-emitting diode is disclosed for example in JP 2015-170717 A (PTL 1).

A point source light-emitting diode disclosed in PTL 1 has a metal layer, a first conductivity type layer, a light emitting layer, a second conductivity type layer including a current confinement structure, and a top electrode provided with a light emission window through which light generated in the light emitting layer is extracted, in this order on a support substrate. In the point source light-emitting diode of PTL 1, in order to limit an energized region in the light emitting layer to a part of the plane of the light emitting layer, the current confinement structure is formed by providing a current blocking region formed by hydrogen ion implantation in the second conductivity type layer above the active layer. Further, the light from the active layer toward the support substrate below the active layer is partially reflected at a metal reflection surface below the active layer to be extracted through a light emission window, and is partially absorbed in a light-reflection reduction surface below the active layer.

In PTL 1, the point source light-emitting diode is manufactured through a crystal growth step, a dielectric layer formation step, an intermediate-electrode formation step, a metal layer formation step, a diffusion-control barrier layer formation step, a support substrate bonding step, a growth substrate separation step, a current confinement structure formation step, and an electrode formation step.

CITATION LIST

Patent Literature

PTL 1: JP 2015-170717 A

SUMMARY

Technical Problem

In the technique of PTL 1, since the above metal reflection surface and the light reflection reduction surface are formed below the light emitting layer, the production process is complicated. Further, in recent years, there is a demand for point source light emitting diodes that make it possible to reduce light emission from other than the light emission window in a light emission pattern to the minimum possible.

It could therefore be helpful to provide a point source light-emitting diode and a method of producing the same that make it possible to simplify the production process and reduce light emission from other than the light emission window in an emission pattern.

Solution to Problem

The present inventors made diligent studies to solve the above problem. In the studies, they contemplated sequentially forming an hydrogen ion implanted area in a point source light-emitting diode obtained by forming an n-type cladding layer, a light emitting layer, a p-type cladding layer, an n-type current confinement layer having an opening, and a p-type contact layer on a substrate, and providing a p-type electrode having an mission window. They also found that providing the hydrogen ion implanted area extending from the p-type contact layer to the light emitting layer in the thickness direction can reduce light emission from other than the light emission window in an emission pattern. This disclosure is made based on the above findings and has the following features.

(1) A point source light-emitting diode comprising:
 a substrate;
 an n-type cladding layer on the substrate;
 a light emitting layer on the n-type cladding layer;
 a p-type cladding layer on the light emitting layer;
 an n-type current confinement layer that is provided on the p-type cladding layer and has an opening in which a part of the p-type cladding layer is exposed;
 a p-type contact layer provided on an exposed surface of the p-type cladding layer and on the n-type current confinement layer; and
 a p-type electrode that is provided on the p-type contact layer and has a light emission window concentric with the opening,
 wherein a window opening width of the light emission window is equal to or larger than an opening width of the opening,
 the point source light-emitting diode has a hydrogen ion implanted area extending from the p-type contact layer to the light emitting layer in the thickness direction, and
 the light emitting layer has a non-implanted region that has a region width larger than the window opening width of the light emission window and is concentric with the light emission window, and a hydrogen ion implanted region enclosing the non-implanted region.

(2) The point source light-emitting diode according to (1) above, wherein a hydrogen concentration of the hydrogen ion implanted region in the light emitting layer is equal to or higher than 3.0 times a hydrogen concentration of the non-implanted region, and a hydrogen concentration of the hydrogen ion implanted region is $5.0 \times 10^{17}$ atoms/cm$^3$ or more.

(3) The point source light-emitting diode according to (2) above, wherein the hydrogen concentration of the hydrogen ion implanted region is $2.0 \times 10^{19}$ atoms/cm$^3$ or less.

(4) A method of producing a point source light-emitting diode, comprising:
 a semiconductor layer formation step of sequentially forming an n-type cladding layer, a light emitting layer, a p-type cladding layer, and an n-type semiconductor layer on a substrate;
 an n-type current confinement layer formation step of forming an opening with an opening with of A in the n-type semiconductor layer, thereby forming an n-type current confinement layer such that a part of the p-type cladding layer is exposed;

a p-type contact layer formation step of forming a p-type contact layer on an exposed surface of the p-type cladding layer and on the n-type current confinement layer;

a mask formation step of forming a mask that is concentric with the opening and has a mask width of B on the p-type contact layer;

a hydrogen ion implanting step of implanting hydrogen ions through a surface of the p-type contact layer, thereby forming a hydrogen ion implanted area extending from the p-type contact layer to the light emitting layer in the thickness direction; and a p-type electrode formation step of removing the mask and then forming, on the p-type contact layer, a p-type electrode that is concentric with the opening and has a light emission window with a window opening width C equal to or larger than the opening width A of the opening and smaller than the mask width B.

(5) The method of producing a point source light-emitting diode, according to (4) above, wherein a hydrogen ion dose in the hydrogen ion implanting step is $1.0 \times 10^{13}$ atoms/cm$^2$ or more.

(6) The method of producing a point source light-emitting diode, according to (5) above, wherein the hydrogen ion dose in the hydrogen ion implanting step is $2.0 \times 10^{15}$ atoms/cm$^2$ or less.

Advantageous Effect

This disclosure can provide a point source light-emitting diode and a method of producing the same that make it possible to simplify the production process and reduce light emission from other than the light emission window in an emission pattern.

DETAILED DESCRIPTION

Figure 1:
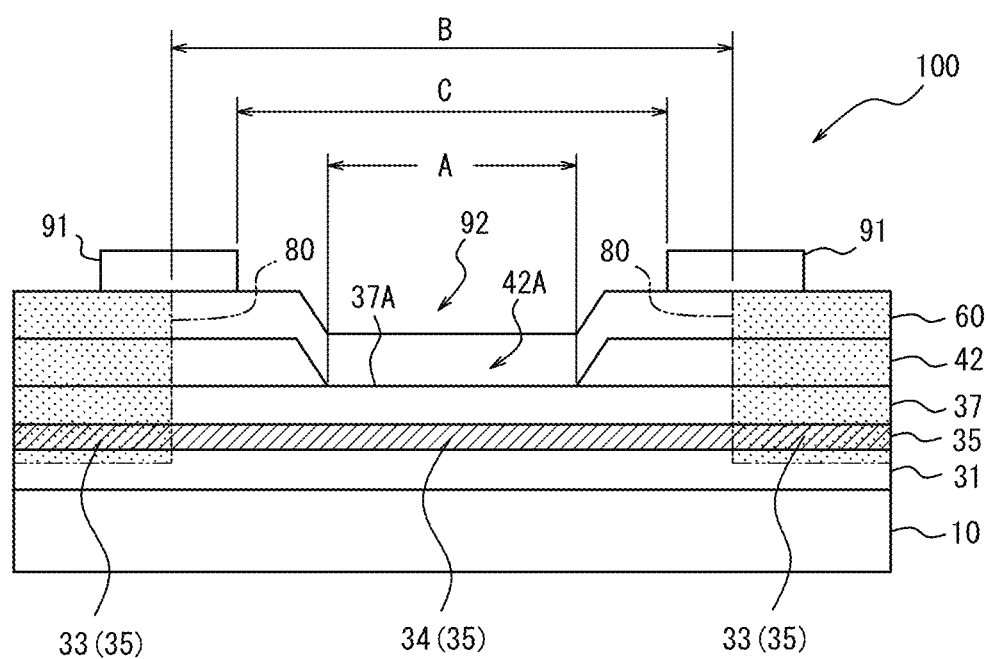
FIG. 1 is a schematic cross-sectional view illustrating one example of a point source light-emitting diode of this disclosure.

Prior to describing embodiments of this disclosure, the definitions of terms in this specification are described.

Definitions

<III-V Compound Semiconductor>

First, when referring simply to a "III-V compound semiconductor" in this specification, the composition thereof is represented by a general formula: $(In_aGa_bAl_c)(P_xAs_ySb_z)$. The following relationships hold for the composition ratios of the constituent elements.

For Group III elements, $c=1-a-b$, $0 \leq a \leq 1$, $0 \leq b \leq 1$, $0 \leq c \leq 1$ For Group V elements, $z=1-x-y$, $0 \leq x \leq 1$, $0 \leq y \leq 1$, $0 \leq z \leq 1$ <p-Type, n-Type, and Undoped; and Dopant Concentration>

In this specification, a layer serving as an electrically p-type layer is referred to as, for example, a p-type semiconductor layer (may also be simply referred to as a "p-type" layer), and a layer serving as an electrically n-type layer is referred to as, for example, an n-type semiconductor layer (may also be simply referred to as an "n-type" layer). On the other hand, when not being deliberately doped with impurities such as Si, Zn, S, Sn, Mg, Se, or C, the layer is described as being "undoped". An undoped III-V compound semiconductor layer may contain impurities that are unavoidably mixed in the production process. Specifically, when a layer has a low dopant concentration (for example, less than $7.6 \times 10^{15}$ atoms/cm$^3$), the layer is treated as being "undoped" in this specification. The values of the impurity concentrations of Si, Zn, S, Sn, Mg, Se, C, etc. are determined by SIMS analysis. Note that since the value of the dopant concentration greatly varies in the vicinity of the boundaries between semiconductor layers, the value of the dopant concentration is found as the value of the dopant concentration at the center in the thickness direction of each layer.

<Thickness and Composition of Layers>

The total thickness of the layers formed can be measured using a thickness measurement system using optical interferometry. Moreover, the thickness of each layer can be calculated by using a thickness measurement system using optical interferometry and observing a cross section of a growth layer under a transmission electron microscope. Moreover, when the thickness of the layers is as small as several nanometers similar to that of the layers in a superlattice structure, the thickness can be measured using TEM-EDS. Note that in a cross-sectional view of the layers, even when a certain layer has a mesa (inclined plane), for the thickness of the layer, the maximum height from a flat surface of a layer immediately under that layer is used without taking the mesa into account.

<Hydrogen Concentration>

The hydrogen concentration is determined by secondary ion mass spectrometry (SIMS), and the average concentration in the depth direction of each layer is used. Note that for the value of the hydrogen concentration in this disclosure, the value of the hydrogen concentration of a light emitting layer of which position in the depth direction can easily be determined by SIMS is used. The entire region implanted with hydrogen ions is referred to as a hydrogen ion implanted area, and an area of the hydrogen ion implanted area in the in-plane direction of the light emitting layer is referred to as a hydrogen ion implanted region. The area of the light emitting layer other than the hydrogen ion implanted region is referred to as a non-implanted region. In the light emitting layer immediately after epitaxial growth, little variation is found in the hydrogen concentration in the wafer in-plane direction in the light emitting layer. The hydrogen concentration varies in the in-plane direction when hydrogen ion implantation is performed after forming a mask. When the hydrogen concentration of the hydrogen ion implanted region is equal to or higher than 3.0 times the hydrogen concentration of the non-implanted region implanted with no hydrogen ions immediately under the mask, the boundary between the hydrogen ion implanted region and the non-implanted region can be demarcated by a measurement of the in-plane profile of the hydrogen concentration. The hydrogen concentration of the light emitting layer implanted with no hydrogen ions (non-implanted region) immediately after epitaxial growth is preferably $2.0 \times 10^{17}$ atoms/cm$^3$ or less.

Referring to the drawings, a point source light-emitting diode and a method of producing the same will now be described in succession. In principle, like components are denoted by like reference numerals, and the description will not be repeated. A substrate and layers in each drawing are exaggerated in thickness for convenience of description, so that the ratio between the vertical and horizontal dimensions of each illustrated component does not conform to the actual ratio. Further, "the same" herein does not refer to mathematically strict equality, and may naturally involve errors tolerated as long as the operation and effect of the disclosed features can be achieved, including unavoidable errors in the production process.

(Point Source Light-Emitting Diode)

Referring to FIG. 1, an example of a point source light-emitting diode 100 of this disclosure will be described. The point source light-emitting diode 100 at least includes: a substrate 10; an n-type cladding layer 31 on the substrate 10; a light emitting layer 35 on the n-type cladding layer 31; a p-type cladding layer 37 on the light emitting layer 35; an n-type current confinement layer 42 that is provided on the p-type cladding layer 37 and has an opening 42A such that a part of the p-type cladding layer 37 is exposed; a p-type contact layer 60 provided on an exposed surface 37A of the p-type cladding layer 37 and on the n-type current confinement layer 42; and a p-type electrode 91 that is provided on the p-type contact layer 60 and has a light emission window 92 concentric with the opening 42A.

It should be noted that the point source light-emitting diode 100 may have layers other than the above layers, not shown in FIG. 1, between layers on the substrate 10. For example, an initial growth layer, an n-type DBR layer, a spacer layer, a p-type DBR layer, etc. to be described may be provided. Further, an n-type electrode not shown may be provided.

The light emission window 92 in the point source light-emitting diode 100 has a window opening width C that is equal to or larger than the opening width A of the opening 42A (accordingly, C A). The point source light-emitting diode 100 also has a hydrogen ion implanted area 80 extending from the p-type contact layer 60 to the light emitting layer 35 in the thickness direction. This hydrogen implanted area 80 forms a boundary between a hydrogen ion implanted region 33 and a non-implanted region 34 in the light emitting layer 35. The light emitting layer 35 has the hydrogen ion implanted region 33 and the non-implanted region 34. Of these, the non-implanted region 34 is concentric with the light emission window 92 and has a region width B larger than the window opening width C of the light emission window 92 (accordingly, B>C). Further, the hydrogen ion implanted region 33 encloses the non-implanted region 34. The relationship between the opening width A of the opening 42A, the region width B of the non-implanted region 34, and the window opening width C of the light emission window 92 is simplified to A≤C<B.

The shapes of the opening 42A, the light emission window 92, and the non-implanted region 34 viewed from above may be a circular shape, an elliptical shape, a polygonal shape, or a rectangular shape with rounded corners, which are concentric (have the same geometric center). Further, the shapes of the opening 42A, the light emission window 92, the non-implanted region 34 are preferably similar to each other. The widths A, B, and C each refers to the diameter for a circular shape, the major axis for an elliptical shape, and the diameter of the circumscribed circle for a polygonal shape or a rectangular shape with rounded corners.

The point source light-emitting diode 100 has the above structure, in which particularly the hydrogen ion implanted area 80 forms the hydrogen ion implanted region 33 in the light emitting layer 35, so that light emission from other than the light emission window 92 in an emission pattern can be reduced. When the relationship between the widths is A≤C<B, a current flows from the vicinity of the inner circumference of the p-type electrode 91, between the region width B and the window opening width C in FIG. 1 toward the light emitting layer 35 through the opening 42A of the n-type current confinement layer 42 having the opening width A via the p-type contact layer 60, and a region immediately under the opening 42A in the light emitting layer 35 becomes a substantial light emitting region. Since the n-type current confinement layer 42 has the current confining effect, the hydrogen ion implanted area 80 does not have the current confining effect as disclosed in PTL 1 mentioned above. In other words, if hydrogen ion implantation is aimed at the current confining effect, in the structure of this disclosure having the n-type current confinement layer 42 between the light emitting layer 35 and the p-type electrode 91 having the light emission window 92, the hydrogen ion implanted area 80 is not necessary provided. The reason the hydrogen ion implanted area 80 reduces light emission from other than the light emission window 92 in an emission pattern is not uncertain; however, providing the hydrogen ion implanted area 80 was found to effectively reduce light emission from other than the light emission window 92.

In order to further ensure the above reduction effect for emission other than the light emission window in an emission pattern, preferably, the hydrogen concentration of the hydrogen ion implanted region 33 in the light emitting layer 35 is equal to or more than 3.0 times the hydrogen concentration of the non-implanted region 34 and the hydrogen concentration of the hydrogen ion implanted region 33 is preferably $5.0 \times 10^{17}$ atoms/cm$^3$ or more, and more preferably $6.0 \times 10^{17}$ atoms/cm$^3$ or more. Further, the hydrogen concentration of the hydrogen ion implanted region 33 is preferably $2.0 \times 10^{19}$ atoms/cm$^3$ or less.

Referring to FIG. 2 to FIG. 5, through a description of an example of a method of producing a point source light-emitting diode 200 that is the above point source light-emitting diode 100 further including a preferred structure, features applicable to the point source light-emitting diode according to this disclosure will now be described. Numerals constituted by two digits of numbers and signs attached to those numerals refer to the components in FIG. 1 to FIG. 5, and the description will not be repeated.

(Method of Producing Point Source Light-Emitting Diode)

Figure 4:
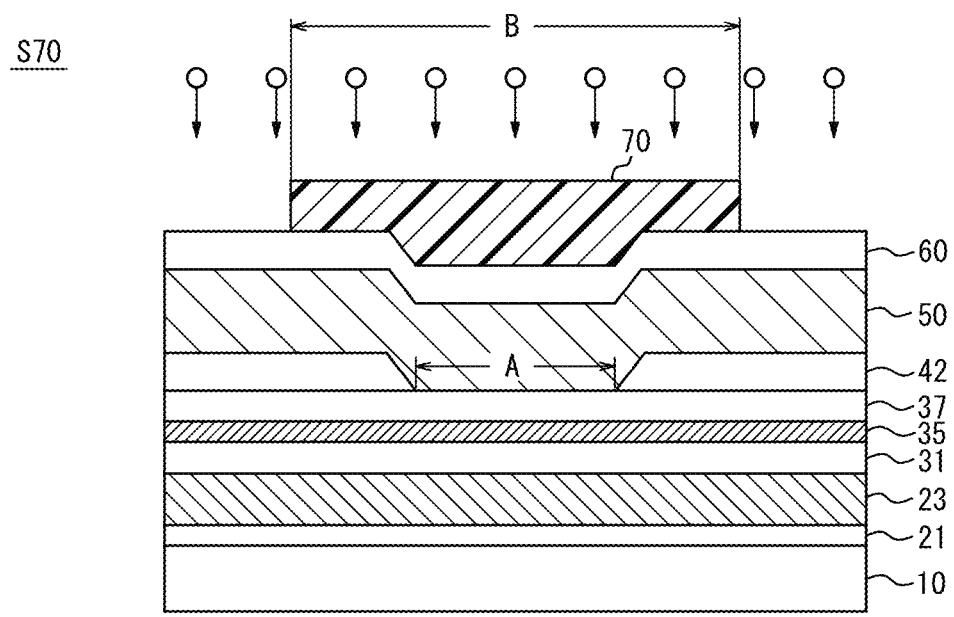
FIG. 4 is a schematic cross-sectional view illustrating steps of one example of the production process according to this disclosure, subsequent to the steps in FIG. 3.
Figure 4:
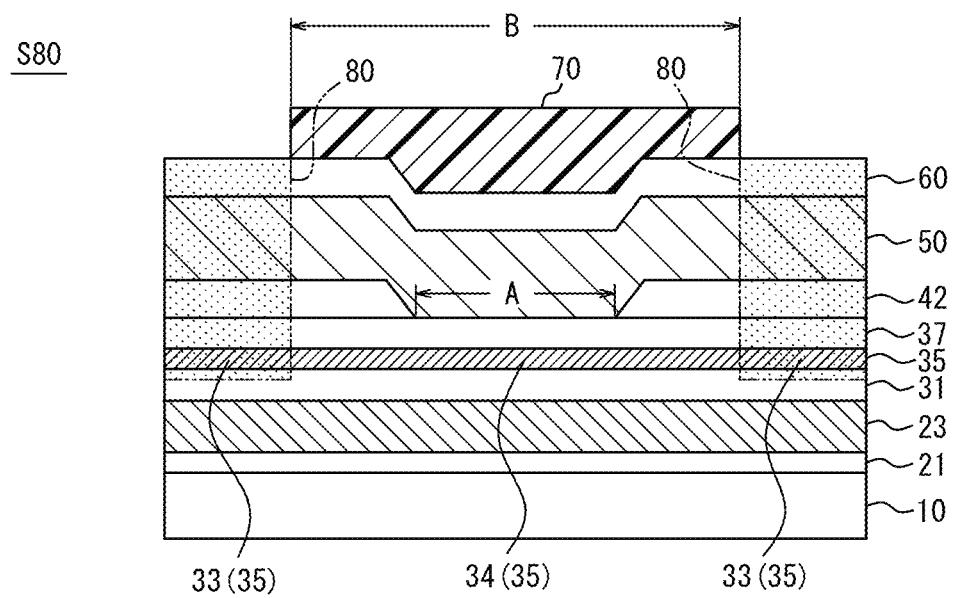
Figure 5:
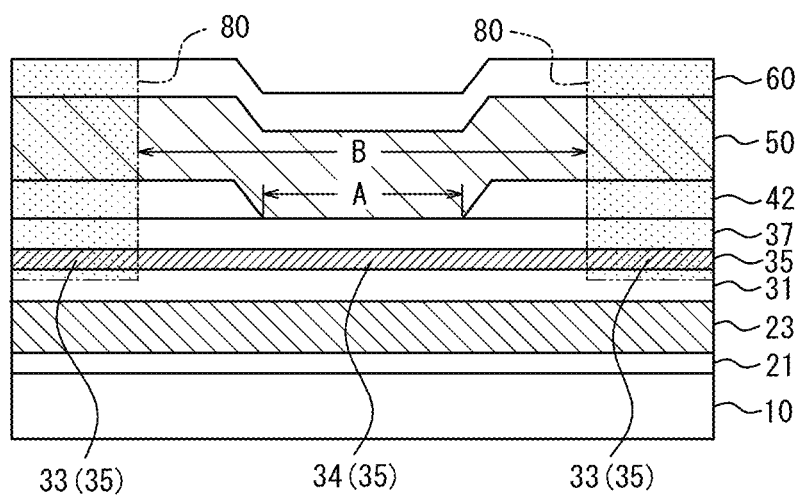
FIG. 5 is a schematic cross-sectional view illustrating steps of one example of the production process according to this disclosure, subsequent to the steps in FIG. 4.
Figure 5:
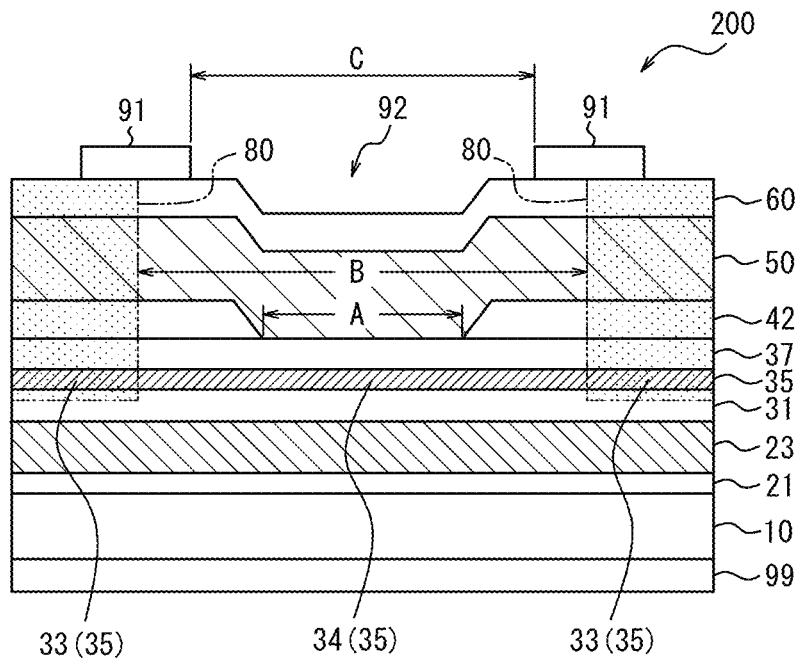

A method of producing the point source light-emitting diode 200 includes as least: a semiconductor layer formation step of sequentially forming, an n-type cladding layer 31, a light emitting layer 35, a p-type cladding layer 37, and an n-type semiconductor layer 41 on a substrate 10 (see S10 and S20 in FIG. 2); an n-type current confinement layer formation step of forming an n-type current confinement layer 42 in which an opening 42A with an opening width A is formed in the n-type semiconductor layer 41 to expose a part of the p-type cladding layer 37 (see S30 in FIG. 2); a p-type contact layer formation step of forming a p-type contact layer 60 on an exposed surface 37A of the p-type cladding layer 37 and on the n-type current confinement layer 42 (see S50 in FIG. 3); a mask formation step of forming a mask 70 that is concentric with the opening 42A and has a mask width B on the p-type contact layer 60 (see S60 in FIG. 3); a hydrogen ion implanting step of implanting hydrogen ions through a surface of the p-type contact layer 60, thereby forming a hydrogen ion implanted area 80 extending from the p-type contact layer 60 to the light emitting layer 35 in the thickness direction (see S70 and S80 in FIG. 4); and a p-type electrode formation step of removing the mask 70 and then forming the p-type electrode 91 having a light emission window 92 that is concentric with the opening 42A and has a window opening width C equal to or larger than the opening width A of the opening 42A and smaller than the mask width B on the p-type contact layer 60 (see S90 and S100 in FIG. 5). As illustrated in S20 of FIG. 2, in the semiconductor layer formation step, either or both of an initial growth layer 21 and an n-type DBR (distributed Bragg reflector) layer 23 may preferably be formed between the substrate 10 and the n-type cladding layer 31. Further, as illustrated in S40 and S50 of FIG. 3, the method of producing the point source light-emitting diode 200 also preferably includes a p-type DBR layer formation step of forming a p-type DBR layer 50 between the exposed surface 37A of the p-type cladding layer 37 together with the n-type current confinement layer 42 and the p-type contact layer 60. The details of steps and constituent components will now be described in succession.

(Semiconductor Layer Formation Step)

Figure 2:
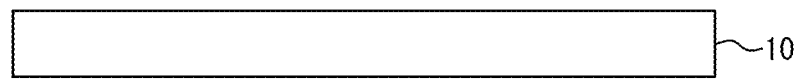
FIG. 2 is a schematic cross-sectional view illustrating one example of the production process of a point source light-emitting diode, according to this disclosure.
Figure 2:
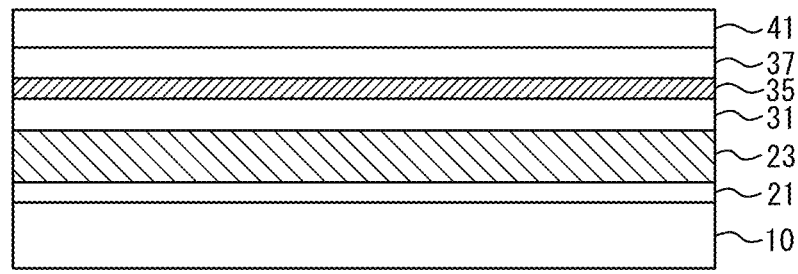
Figure 2:
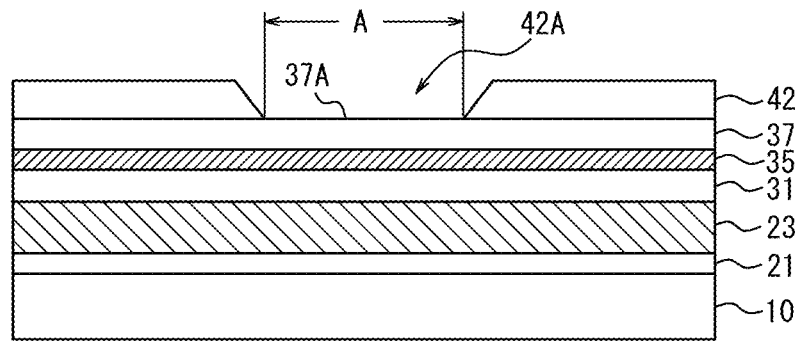

Reference is made to S10 and S20 in FIG. 2. In the semiconductor layer formation step, the initial growth layer 21, the n-type DBR layer 23, the n-type cladding layer 31, the light emitting layer 35, the p-type cladding layer 37, and the n-type semiconductor layer 41 are sequentially formed on the substrate 10. The formation of the initial growth layer 21 and the n-type DBR layer 23 may be omitted.

The layers formed on the substrate 10 in this step are III-V compound semiconductor layers. These layers can be formed by a known thin film deposition technique, for example, metalorganic chemical vapor deposition (MOCVD), molecular beam epitaxy (MBE), or sputtering, and this also applies to the III-V compound semiconductor layers to be formed after this step. When an AlInGaAsP semiconductor layer is formed, trimethylaluminum (TMA) as an Al source, trimethylindium (TMIn) as an In source, trimethylgallium (TMGa) as a Ga source, arsine ($AsH_3$) as an As source, and phosphine ($PH_3$) as a P source, for example, can be used in a specific mixing ratio, and these source gases can be used to perform vapor phase growth while also using a carrier gas to thereby enable epitaxial growth of the AlInGaAsP semiconductor layer to a desired thickness depending on the growth time. Further, when Sb is used as a Group V element, trimethylantimony (TMSb) for example may be used as an Sb source. Further, when the semiconductor layers are p-type or n-type doped, the semiconductor layers may be grown using a dopant source gas containing a p-type dopant (Zn, C, Mg, etc.) or an n-type dopant (Te, Si, Se, etc.) as a constituent element in combination as desired. Further, the composition of the layers may be uniform in the crystal growth direction, the composition may be graded in the crystal growth direction, or the composition may be modulated (involve irregular changes).

<<Substrate>>

First, the substrate 10 is prepared. The substrate 10 may suitably be selected from a GaAs substrate, an InP substrate, a GaSb substrate, an InSb substrate, etc. depending on the composition and the lattice constant of the semiconductor layer to be grown thereon. Since the n-type cladding layer 31 is formed on the substrate 10 in this embodiment, an n-type semiconductor substrate is preferably used; however, the conductivity type of the substrate 10 may be either undoped or p-type. The following describes the composition of each semiconductor layer taking as an example the case where the substrate 10 is a GaAs substrate, for convenience of description.

<<Initial Growth Layer>>

The initial growth layer 21 is preferably formed on the substrate 10. The initial growth layer 21 can avoid effects of an oxide film, contamination, etc. on the substrate surface of the substrate 10 and can also be used as a buffer layer for buffering lattice strain between the substrate and the semiconductor layer formed thereon. For example, when the substrate 10 is an n-type GaAs substrate, the initial growth layer 21 may be an n-type GaAs layer, and the composition ratio between the Group III element and the Group V element can be controlled within a range such that the layer is lattice matched with the substrate 10. The initial growth layer 21 may be a single layer or may be a composite layer (for example, a superlattice layer) with one or more other layers. The thickness of the initial growth layer 21 may be for example, but not limited to, 10 nm to 100 nm.

<<n-Type DBR Layer>>

The n-type DBR layer 23 is preferably formed on the substrate 10. S20 in FIG. 2 illustrates an example of forming the n-type DBR layer 23 on the initial growth layer 21. The n-type DBR layer 23 is a reflective layer that can be formed by repeatedly stacking low refractive layers and high refractive layers. The thickness of the low refractive index layers and high refractive index layers forming the n-type DBR layer 23 may be appropriately determined depending on the refractive index and the emission wavelength of the layers. It is possible that one end of the laminate structure is a low refractive index layer, a repeating structure of high refractive index layers and low refractive index layers is provided, and the other end is a low refractive index layer. Alternatively, conversely, both ends may be high refractive index layers. In this case, the number of the pairs of the low refractive index layers and high refractive index layers is represented as n (n is a natural number), and the layers are expressed as being in n·5 pairs. The number of the pairs of the low refractive index layers and high refractive index layers may be approximately 5 to 40, and the thickness of the layers may be approximately 500 nm to 4000 nm. The composition of the low refractive index layers and high refractive index layers is not limited, and for example, two n-type AlGaAs layers having different composition ratios may be used.

<<n-Type Cladding Layer>>

The n-type cladding layer 31 is formed on the substrate 10. S20 in FIG. 2 illustrates an example of forming the n-type cladding layer 31 on the n-type DBR layer 23. The composition of III-V compound semiconductors forming the n-type cladding layer 31 may be appropriately determined depending on the composition of the III-V compound semiconductors in the light emitting layer 35, and an example is n-type AlInP. The n-type cladding layer 31 may have a single layer structure or may be a composite layer including a plurality of stacked layers. The thickness of the n-type cladding layer 31 may be for example, but not limited to, 50 nm to 500 nm.

<<Light Emitting Layer>>

The light emitting layer 35 is formed on the n-type cladding layer 31. The light emitting layer 35 may have a single layer structure or may have a single quantum well (SQW) structure in which well layers and barrier layers are stacked, or a multiple quantum well (MQW) structure. With a view to improving the light output by reducing crystal defects, the light emitting layer 35 preferably has a multiple quantum well structure. The emission wavelength may be for example in a range of 580 nm to 4000 nm, and the emission wavelength is preferably in a range of 630 nm to 1100 nm.

The light emitting layer 35 may be made of III-V compound semiconductors. Hereinafter the composition of the III-V compound semiconductors in the light emitting layer 35 is expressed as $(In_{a1}Ga_{b1}Al_{c1})(P_{x1}As_{y1}Sb_{z1})$ where $c_1=1-a_1-b_1$, $z_1=1-x_1-y_1$, $0 \le a_1 \le 1$, $0 \le b_1 \le 1$, $0 \le c_1 \le 1$, $0 \le x_1 \le 1$, $0 \le y_1 \le 1$, and $0 \le z_1 \le 1$. For example, when the center emission wavelength is set to 630 nm to 1100 nm, for the light emitting layer (each layer in the case of a structure including well layers and barrier layers), the composition ratio $a_1$ of In may be 0.0 to 1.0, the composition ratio $b_1$ of Ga may be 0.0 to 1.0, the composition ratio $c_1$ of Al may be 0.0 to 0.5, the composition ratio $x_1$ of P may be 0.0 to 1.0, the composition ratio $y_1$ of As may be 0.0 to 1.0, and the composition ratio $z_1$ of Sb may be 0.0 to 0.5. For example, the well layers may be made of InGaP, and the barrier layers may be made of AlGaInP.

The thickness of the light emitting layer 35 may be for example, but not limited to, 10 nm to 500 nm. Further, the thickness of the well layers in the quantum well structure may be 3 nm to 17 nm and the thickness of the barrier layers therein may be 5 nm to 20 nm. The number of pairs in the case of the multiple quantum-well structure may be, but also not limited to, approximately 5 to 50, and both ends of the multiple quantum-well structure may be barrier layers.

<<p-Type Cladding Layer>>

The p-type cladding layer 37 is formed on the light emitting layer 35. The composition of III-V compound semiconductors forming the p-type cladding layer 37 may be appropriately determined depending on the composition of the III-V compound semiconductors in the light emitting layer 35, and an example is p-type AlInP. The p-type cladding layer 37 may have a single layer structure or may be a composite layer including a plurality of stacked layers. The thickness of the p-type cladding layer 37 may be for example, but not limited to, 50 nm to 500 nm.

<<n-Type Semiconductor Layer>>

The n-type semiconductor layer 41 is formed on the p-type cladding layer 37. The n-type semiconductor layer 41 forms the n-type current confinement layer 42 after the opening 42A is formed in the next step. The composition of III-V compound semiconductors forming the n-type semiconductor layer 41 may be appropriately determined depending on the composition of the III-V compound semiconductors in the light emitting layer 35, and an example is n-type AlInP. The thickness of the n-type semiconductor layer 41 is not limited as long as the opening 42A can be formed in the next step, and may be, for example, 10 nm to 200 nm.

<<Spacer Layer>>

Although not illustrated, an undoped spacer layer may be formed either or both between the light emitting layer 35 and the n-type cladding layer 31 and between the light emitting layer 35 and the p-type cladding layer 37. The provision of the spacer layer can hinder unnecessary dopant diffusion. The thickness of the spacer layers may be for example, but not limited to, 5 nm to 500 nm.

<n-Type Current Confinement Layer Formation Step>

Reference is made to S30 in FIG. 2. Subsequent to the semiconductor layer formation step, the opening 42A with the opening width A is formed in the n-type semiconductor layer 41, so that the n-type current confinement layer 42 is formed in which a part of the p-type cladding layer 37 is exposed. The exposed surface 37A may be provided in the p-type cladding layer 37 by for example etching the n-type semiconductor layer 41 after forming a mask on the surface of the n-type semiconductor layer 41. The opening width A of the opening 42A may be appropriately determined depending on use, and may be for example, but not limited to, 10 μm to 300 μm. The above opening width A corresponds to the exposure width of the exposed surface 37A. The opening 42A is preferably formed in a circular shape in plan view, yet the shape is not limited, and may be an elliptical shape, a polygonal shape, or a rectangular shape with rounded corners. The exposed side of the n-type current confinement layer 42 may form a vertical plane or may form a mesa (inclined plane). FIG. 2 illustrates a positive mesa having an inclined plane facing in the growth direction; however, the mesa may be either a positive mesa or a negative mesa. When a mesa is present, the opening width A is determined by measuring the width of the minimum shape of the opening 42A when viewed from above.

<p-Type DBR Layer Formation Step>

Figure 3:
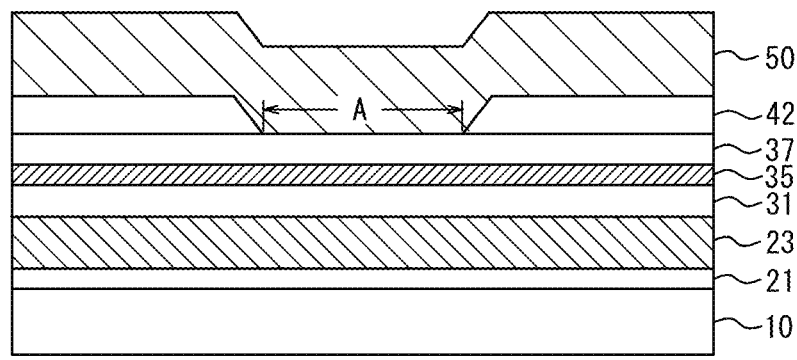
FIG. 3 is a schematic cross-sectional view illustrating steps of one example of the production process according to this disclosure, subsequent to the steps in FIG. 2.
Figure 3:
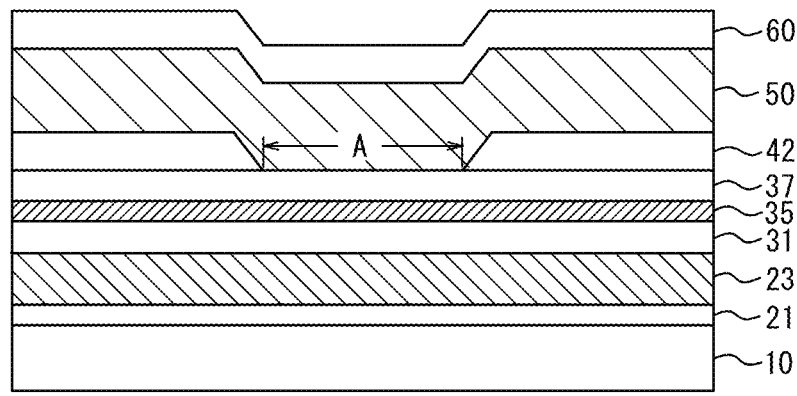
Figure 3:
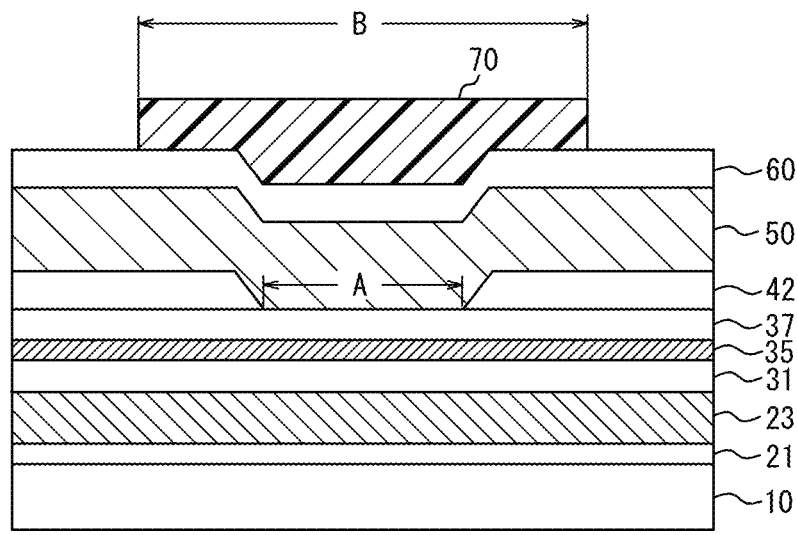

Reference is made to S40 in FIG. 3. The p-type DBR layer 50 is formed on the exposed surface 37A of the p-type cladding layer 37 and on the n-type current confinement layer 42. The formation of the p-type DBR layer 50 may be omitted as necessary. The p-type DBR layer 50 is a reflective layer that can be formed by repeatedly stacking low refractive layers and high refractive layers; although the dopant used for the p-type DBR layer 50 is different from one for the above n-type DBR layer 23, the laminate structure, the number of pairs, and the composition modulation range of the p-type DBR layer 50 are the same as those of the n-type DBR layer 23, and may be appropriately determined such that a DBR structure can be formed. Resonators can also be obtained between the light emitting layer and both the p-type DBR layer 50 and the n-type DBR layer 23. A resonant vertical-cavity light emitting diode may be obtained by appropriately determining the number of pairs for controlling the reflective force for light emission.

<p-Type Contact Layer Formation Step>

Reference is made to S50 in FIG. 3. The p-type contact layer 60 is formed on the exposed surface 37A of the p-type cladding layer 37 and on the n-type current confinement layer 42. In S50 in FIG. 3, the p-type contact layer 60 is formed on the p-type DBR layer 50. The p-type contact layer 60 is a p-type semiconductor layer that forms an ohmic contact with the p-type electrode 91 to be formed thereon. The composition of III-V compound semiconductors forming the p-type contact layer 60 may be appropriately determined depending on the composition of the III-V compound semiconductors in the light emitting layer 35, and an example is p-type GaAs. The p-type contact layer 60 may have a single layer structure or may be a composite layer including a plurality of stacked layers. The thickness of the p-type contact layer 60 may be for example, but not limited to, 10 nm to 100 nm.

<Mask Formation Step>

Reference is made to S60 in FIG. 3. The mask 70 that is concentric with the opening 42A and has the mask width B is formed on the p-type contact layer 60. The mask 70 may be formed using for example a photosensitive resin. The mask width B determines the formation position of the hydrogen ion implanted area to be formed in the next step in the in-plane direction. Accordingly, the mask width B is made larger than the opening width A of the opening 42A and the window opening width C of the light emission window 92 to be formed later. Note that since the opening 42A can be observed with an exposure system, a photomask is easily positioned in the mask formation. The thickness of the mask to be formed may be for example, but not limited to, 1 μm to 5 μm. Further, the measure of the width is not limited as long as the mask width B is larger than the opening width A of the opening 42A and the window opening width C of the light emission window 92 to be formed later. Note that a guide for the upper limit of the mask width B does not exceed the chip size, and may be for example in a range of C+5 μm≤B<chip size−5 μm considering the electrode width and the alignment width. To ensure to reduce light emission from other than the light emission window 92 in an emission pattern, the hydrogen ion implanted region is preferably 5 μm or more from the periphery of a chip, more preferably 10 μm or more therefrom.

<Hydrogen Ion Implanting Step>

Reference is made to S70 and S80 in FIG. 4. After the above-described mask 70 is formed, hydrogen ions are implanted through the surface of the p-type contact layer 60, thereby forming the hydrogen ion implanted area 80 extending from the p-type contact layer 60 to the light emitting layer 35 in the thickness direction. Since hydrogen ions rectilinearly travel and pass through interstices in the lattice, while they deeply penetrate a regular atomic arrangement as in a semiconductor layer or the like, they cannot travel through the mask 70 having a random atomic arrangement. Consequently, the hydrogen ion implanted area 80 is formed in an area where the mask 70 is not formed in the in-plane direction. The hydrogen ion implanted area 80 extends though from the p-type contact layer 60 to the light emitting layer 35 in the thickness direction, so that the hydrogen ion implanted area 80 forms a boundary in the light emitting layer 35 between the hydrogen ion implanted region 33 an the non-implanted region 34. Further, since hydrogen ions rectilinearly travel and do not turn on their tracks, the non-implanted region 34 is concentric with the opening 42A and has the region width B in agreement with the mask width B, and the hydrogen ion implanted region 33 encloses the non-implanted region 34. As is illustrated in the drawings, the hydrogen ion implanted area 80 may be extended to the n-type cladding layer 31 or the layers therebelow in the thickness direction through the light emitting layer 35.

In order to ensure to reduce light emission from other than the light emission window in an emission pattern, the dose of hydrogen ions in this step is preferably $1.0 \times 10^{13}$ atoms/cm$^2$ or more, more preferably $1.9 \times 10^{13}$ atoms/cm$^2$ or more. Further, to prevent the mask 70 from being deteriorated by hydrogen ion implantation, the dose of hydrogen ions into the mask 70 is preferably $2.0 \times 10^{15}$ atoms/cm$^2$ or less, more preferably $1.0 \times 10^{15}$ atoms/cm$^2$ or less. The dose may be controlled by appropriately changing the irradiation time or the like in the hydrogen ion implantation. The acceleration voltage on hydrogen ions has an effect on the implantation depth of hydrogen ions, and so may be appropriately determined depending on the formation area of the hydrogen ion implanted area 80 in the thickness direction and the thickness of the layers, and may be for example 10 keV to 300 keV.

<p-Type Electrode Formation Step>

Reference is made to S90 and S100 in FIG. 5. After forming the hydrogen ion implanted area 80, the mask 70 is removed (S90). Subsequently, the p-type electrode 91 having the light emission window 92 that is concentric with the opening 42A and has the window opening width C equal to or larger than the opening width A of the opening 42A and smaller than the mask width B is formed on the p-type contact layer 60 (S100). The p-type electrode 91 may be formed by sputtering, electron beam vapor deposition, resistance heating, etc. after forming a photo resist or the like. In S100 in FIG. 5, the p-type electrode 91 is formed to enclose the recess in the p-type contact layer 60, the recess being formed in association with the formation of the opening 42A; however, the formation position of the electrode is not limited to the illustrated example as long as the above relationship between the opening width A, the mask width B, and the window opening width C is satisfied. The window opening width C is not limited as long as it is equal to or larger than the opening width A of the opening 42A and smaller than the mask width B, and may be 10 μm to 310 μm.

Further, an n-type electrode 99 may be formed if necessary. In S100 in FIG. 5, the n-type electrode 99 is formed on the rear surface of substrate 10; however, it is a mere example, and the formation position may be appropriately determined depending on for example the conductivity type of the substrate 10. The n-type electrode 99 may also be formed by sputtering or the like.

In the point source light-emitting diode 200 described above, the hydrogen ion implanted area 80 is formed using the mask width B of the mask 70, so that the hydrogen ion implanted area 80 can be formed relatively easily. The point source light-emitting diode thus obtained can reduce light emission from other than the light emission window 92 in an emission pattern.

It should be noted that the above embodiment of a method of producing the point source light-emitting diode 200 is a mere example of fabricating the point source light-emitting diode 100. To fabricate the point source light-emitting diode 100, techniques other than those in the above embodiment of a method of producing the point source light-emitting diode 200 can be used as long as the structure of the point source light-emitting diode 100 can be actually obtained.

EXAMPLES

The following provides a more detailed description of this disclosure using examples. However, this disclosure is not in any way limited by the following examples.

Example 1

A point source light-emitting diode of Example 1 was fabricated in accordance with the order of steps illustrated in FIGS. 2 to 5. The steps are specifically described below.

An n-type GaAs layer (thickness: 75 nm, initial growth layer) was formed on the (100) plane of an n-type GaAs substrate (substrate thickness: 350 μm). Next, an n-type DBR layer (total thickness: 2068 nm) in which 20.5 pairs of Se-doped n-type $Al_{0.45}Ga_{0.55}As$ layers (thickness: 48 nm) and Se-doped n-type AlAs layers (thickness: 53 nm)(n-type $Al_{0.45}Ga_{0.55}As$ layers on both ends) were stacked was formed. Next, on the n-type DBR layer, an n-type Se-doped $Al_{0.5}In_{0.5}P$ cladding layer (thickness: 148 nm); a light emitting layer with a dominant emission wavelength of 650 nm having a three quantum well (3QW) structure including undoped $In_{0.5}Ga_{0.5}P$ layers (thickness: 8 nm, well layers), and undoped $Al_{0.35}Ga_{0.15}In_{0.5}P$ layers (thickness: 5 nm, barrier layers)(total thickness: 43 nm); and a p-type Mg-doped $Al_{0.5}In_{0.5}P$ layer (thickness: 250 nm, p-type cladding layer) were sequentially formed by MOCVD.

Next, an n-type $Al_{0.5}In_{0.5}P$ layer (thickness: 20 nm) was formed on the p-type cladding layer, and etching was performed after forming a resist pattern to expose a part of the p-type cladding layer, thereby forming a circular opening with an opening width of 80 μm (diameter: 80 μm), thus an n-type current confinement layer was obtained.

Subsequently, a p-type DBR layer (total thickness: 1180 nm) obtained by stacking 10.5 pairs of p-type C-doped $Al_{0.45}Ga_{0.55}As$ layers (thickness: 50 nm) and p-type C-doped $Al_{0.95}Ga_{0.05}As$ layers (thickness: 63 nm)(both ends were p-type $Al_{0.45}Ga_{0.55}As$ layers) was formed on the exposed surface of the p-type cladding layer and on the n-type current confinement layer.

Further, a p-type contact layer constituted by a p-type Zn-doped GaAs layer (thickness: 20 nm) was formed on the p-type DBR layer.

Next, a circular resist mask having a mask width of 180 μm (diameter: 180 μm) was formed on the p-type contact layer so to be concentric with the opening of the n-type current confinement layer. Further, a hydrogen ion implanted area was formed by implanting hydrogen ions through the surface of the p-type contact layer at an acceleration voltage of 145 keV at a dose of $2.0\times10^{14}$ atoms/cm². The hydrogen ion implanted area extended through in the thickness direction from the p-type contact layer to the n-type cladding layer.

Further, after removing the mask, a p-type electrode (electrode material: AuZn alloy) with a size of 200 μm×350 μm having an emission window with a window opening width of 160 μm (diameter: 160 μm) was formed on the p-type contact layer so as to be concentric with the opening of the n-type current confinement layer. After that, a mask was formed on an area of 220 μm×370 μm to completely cover the p-type electrode extending off from the p-type electrode by a width of 10 μm, and the semiconductor layers outside the mask area on the substrate were removed by etching. Further, an n-type electrode (electrode material: AuGe alloy) was formed on the whole rear surface of the n-type GaAs substrate. After performing heat treatment for forming an ohmic contact, the substrate was cut by dicing at positions where the semiconductor layers were removed so as to obtain the chip size (250 μm×400 μm), thereby performing isolation into singular chips. An area of the upper surface of each chip obtained, with a width of 10 μm from the periphery of the p-type contact layer was not covered with the p-type electrode. Thus, the point source light-emitting diode according to Example 1 was fabricated.

Example 2

In Example 1, the mask width for ion implantation was 180 μm, the width of the window opening of the light emission window was 160 μm, and the hydrogen ion dose was set to $2.0\times10^{14}$ atoms/cm²; a point source light-emitting diode according to Example 2 was fabricated in the same manner as in Example 1 except that the mask width was 100 μm, the window opening width was 80 μm, and the hydrogen ion dose was $2.0\times10^{13}$ atoms/cm².

Comparative Example 1

In Example 1, the hydrogen ion implanted area was formed; a point source light-emitting diode according to Comparative Example 1 was formed in the same manner as in Example 1 except that the ion implanted area was not formed.

Comparative Example 2

In Example 2, the hydrogen ion implanted area was formed; a point source light-emitting diode according to Comparative Example 2 was formed in the same manner as in Example 2 except that the ion implanted area was not formed.

<Evaluation of Hydrogen Concentration>

Figure 6:
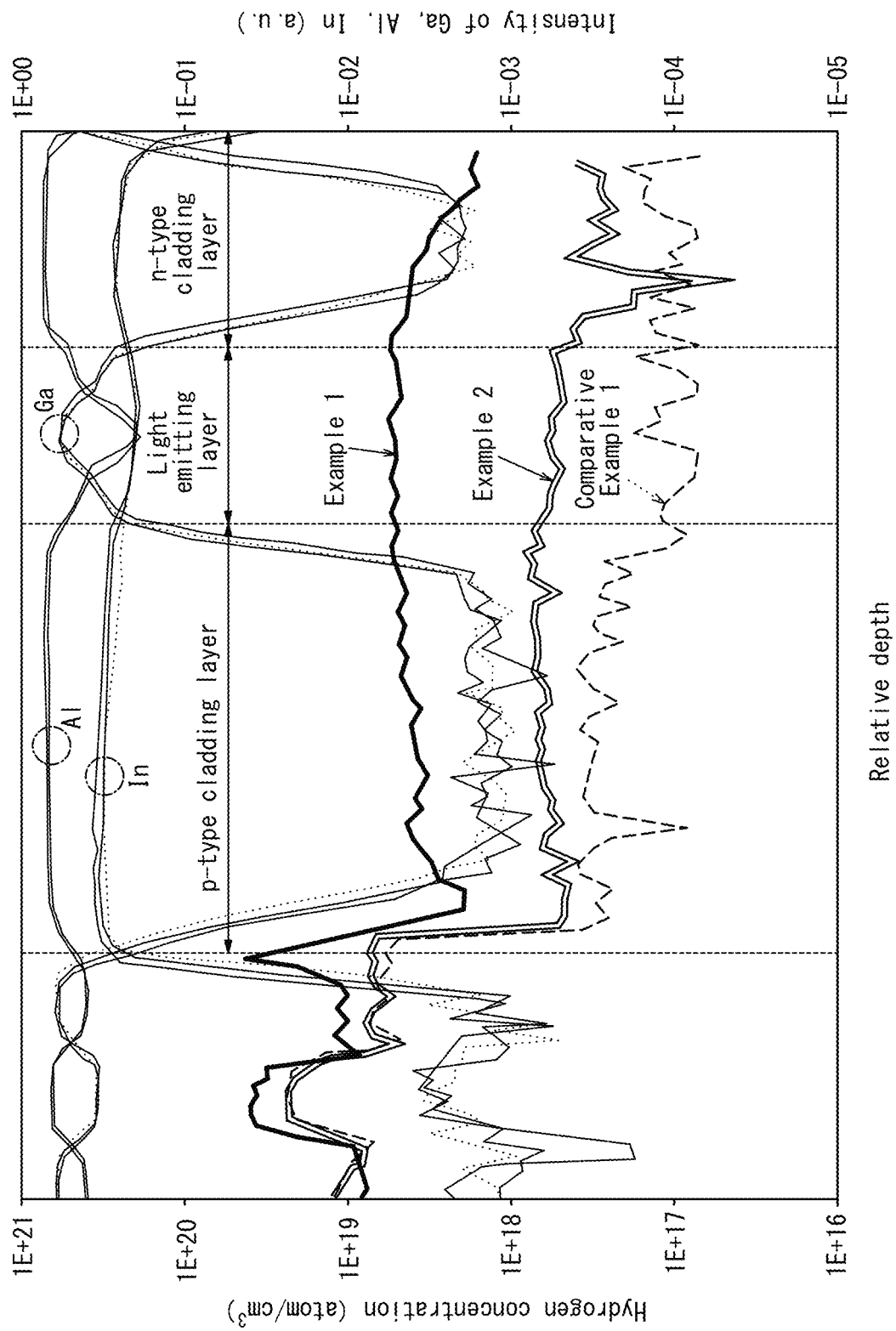
FIG. 6 presents the hydrogen concentration and the intensity profiles of Ga, Al, and In in the depth direction, obtained by SIMS in Examples 1 to 2 and Comparative Example 1.

The hydrogen concentration of the hydrogen ion implanted area in the depth direction in Example 1 was measured by SIMS. The results are given in the graph of FIG. 6. The horizontal axis in FIG. 6 represents the relative depth, and the depth ranges corresponding to the p-type cladding layer, the light emitting layer, and the n-type cladding layer are annotated with the semiconductor layers. Further, the hydrogen concentration in each of Example 2 and Comparative Examples 1 and 2 was measured by SIMS for the same position as in Example 1. The results of Example 2 and Comparative Example 1 are also given in the graph of FIG. 6. Note that the hydrogen concentration of the light emitting layer was $2.0\times10^{17}$ atoms/cm³ in Comparative Example 1 and Comparative Example 2 where hydrogen ions were not implanted. The hydrogen concentration of the light emitting layer in Comparative Example 2 was the same as that in Comparative Example 1, and so is not given in the graph of FIG. 6. In Example 1, the hydrogen concentration of a hydrogen ion implanted region in the light emitting layer was $5.0\times10^{18}$ atoms/cm³, and in Example 2, the hydrogen concentration of the hydrogen ion implanted region in the light emitting layer was $6.0\times10^{17}$ atoms/cm³. Further, aside from FIG. 6, the hydrogen concentration of a non-implanted region in the light emitting layer to which no hydrogen ions had been implanted was measured by SIMS in each of Examples 1 and 2, and the hydrogen concentration in Examples 1 and 2 was approximately the same as those in Comparative Example 1 and 2 where hydrogen ion implantation was not performed.

<Evaluation of Light Intensity Profile>

Figure 7:
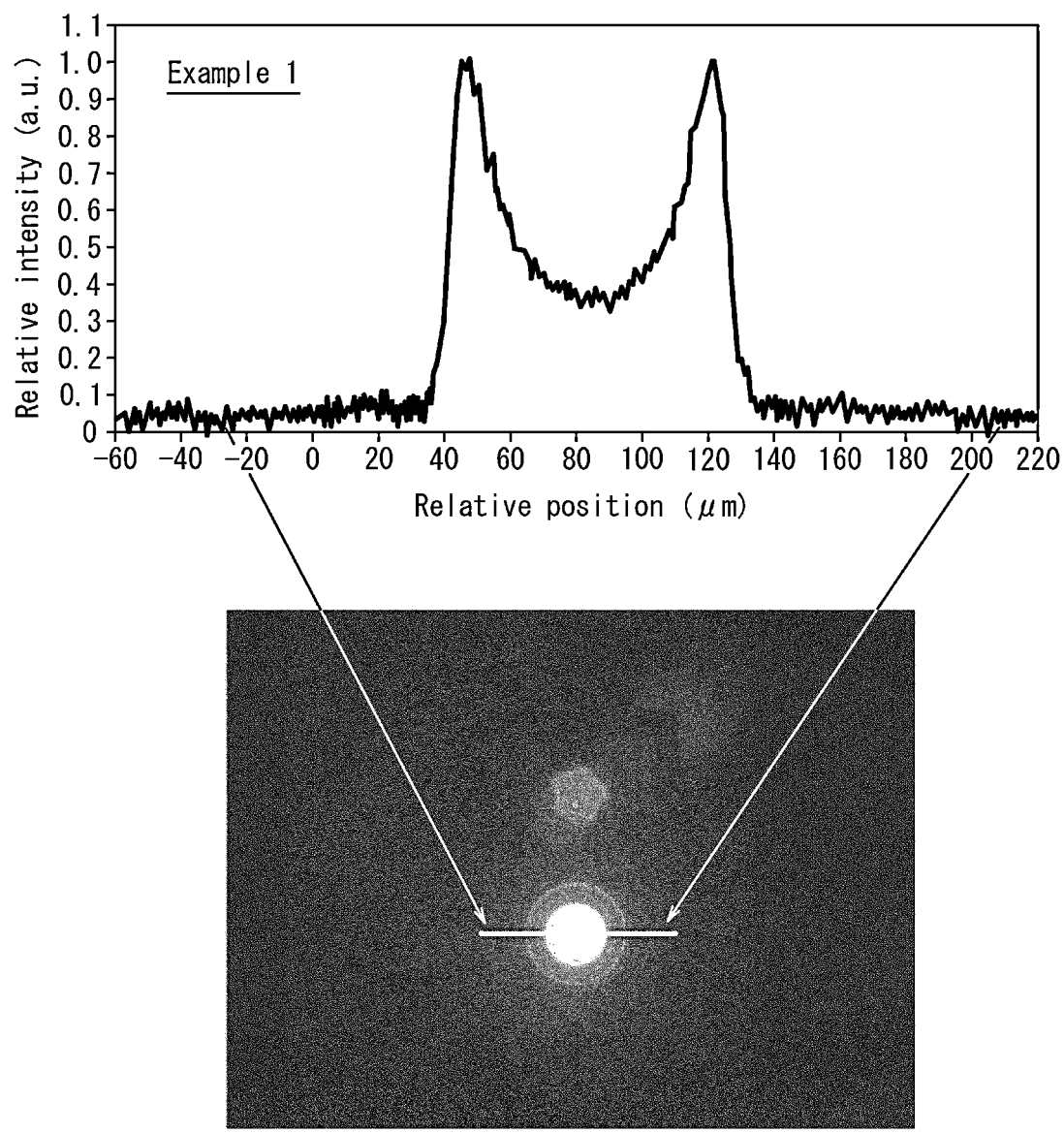
FIG. 7 is a graph of the emission intensity profile obtained when a point source light-emitting diode of Example 1 was made to emit light, with a photograph of the light emission.
Figure 8:
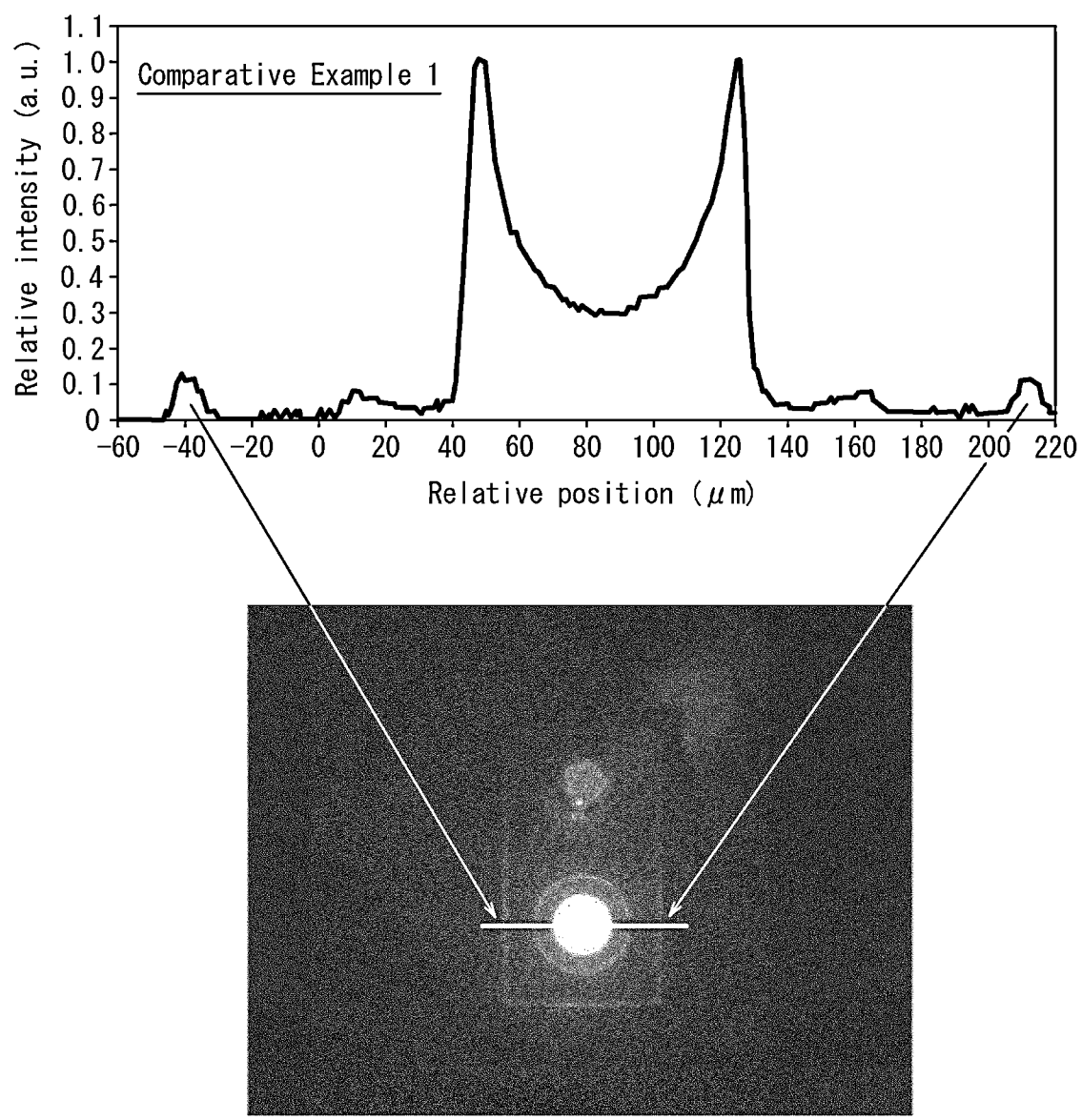
FIG. 8 is a graph of the emission intensity profile obtained when a point source light-emitting diode of Comparative Example 1 was made to emit light, with a photograph of the light emission.
Figure 9:
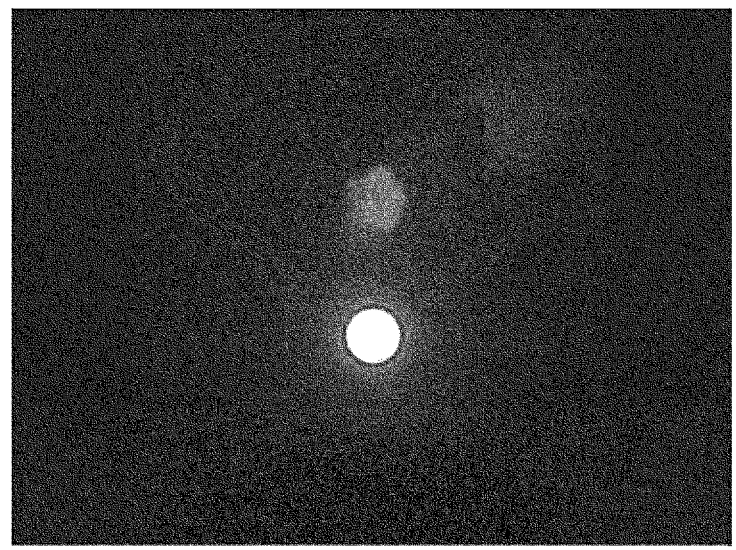
FIG. 9 is a photograph of light emission obtained when a point source light-emitting diode of Example 2 was made to emit light.
Figure 10:
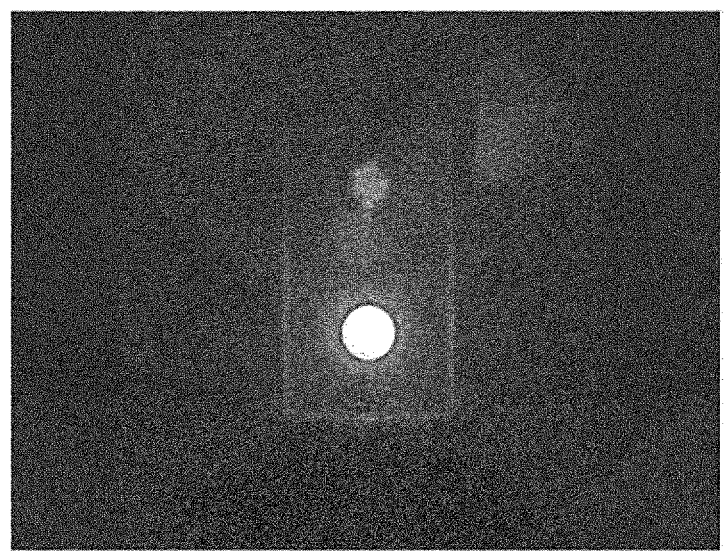
FIG. 10 is a photograph of light emission obtained when a point source light-emitting diode of Comparative Example 2 was made to emit light.

The point source light-emitting diode according to Example 1 was operated by pulses (pulse forward current Ifp: 300 mA, frequency: 10 kHz, duty cycle: 1.0%). The emission intensity profile in the transverse cross section including the opening in this case is given in FIG. 7. Further, a photograph of the point source light-emitting diode according to Example 1 to which a DC current of 1 mA was applied to enhance light emission was taken. The photograph taken is also given in FIG. 7 with its positional correspondence with the graph in FIG. 7. Note that the vertical axis in the graph of FIG. 7 represents the emission intensity (relative intensity), and the horizontal axis therein represents the relative position in the transverse cross section. Similarly, the emission intensity profile of the point source light-emitting diode according to Comparative Example 1 was also measured and a photograph of the point source light-emitting diode was taken during light emission. The results are given in FIG. 8. Further, for Example 2 and Comparative Example 2, a photograph of light emission at a DC current of 1 mA was taken. The results are given in FIG. 9 and FIG. 10, respectively.

Comparing FIG. 7 to FIG. 10, most of light is emitted through the opening in Examples 1 and 2; on the other hand, a small amount of light was found to exit also from other than the opening (an outer peripheral portion around the p-type contact layer that was not covered with the p-type electrode) in Comparative Examples 1 and 2. It was demonstrated that light emission from other than a light emission window in an emission pattern can be reduced in a point source light-emitting diode by providing a hydrogen ion implanted area.

INDUSTRIAL APPLICABILITY

This disclosure provides a point source light-emitting diode and a method of producing the same that make it possible to simplify the production process and reduce light emission from other than the light emission window in an emission pattern.

REFERENCE SIGNS LIST

10: Substrate
21: Buffer layer
23: n-type DBR layer
31: n-type cladding layer
33: Hydrogen ion implanted region
34: Non-implanted region
35: Light emitting layer
37: p-type cladding layer
37A: Exposed surface of p-type cladding layer
41: n-type current confinement layer
42: n-type current confinement layer
42A: Opening
50: p-type DBR layer
60: p-type contact layer
70: Mask
80: Hydrogen ion implanted area
91: p-type electrode
92: Light emission window
99: n-type electrode
100: Point source light-emitting diode
200: Point source light-emitting diode

The invention claimed is:

1. A point source light-emitting diode comprising:
a substrate;
an n-type cladding layer on the substrate;
a light emitting layer on the n-type cladding layer;
a p-type cladding layer on the light emitting layer;
an n-type current confinement layer that is provided on the p-type cladding layer and has an opening in which a part of the p-type cladding layer is exposed;
a p-type contact layer provided on an exposed surface of the p-type cladding layer and on the n-type current confinement layer; and
a p-type electrode that is provided on the p-type contact layer and has a light emission window concentric with the opening,
wherein a window opening width of the light emission window is equal to or larger than an opening width of the opening,
the point source light-emitting diode has a hydrogen ion implanted area extending from the p-type contact layer to the light emitting layer in the thickness direction, and
the light emitting layer has a non-implanted region that has a region width larger than the window opening width of the light emission window and is concentric with the light emission window, and a hydrogen ion implanted region enclosing the non-implanted region.

2. The point source light-emitting diode according to claim 1, wherein a hydrogen concentration of the hydrogen ion implanted region in the light emitting layer is equal to or higher than 3.0 times a hydrogen concentration of the non-implanted region, and a hydrogen concentration of the hydrogen ion implanted region is $5.0 \times 10^{17}$ atoms/cm$^3$ or more.

3. The point source light-emitting diode according to claim 2, wherein the hydrogen concentration of the hydrogen ion implanted region is $2.0 \times 10^{19}$ atoms/cm$^3$ or less.

4. A method of producing a point source light-emitting diode, comprising:
a semiconductor layer formation step of sequentially forming an n-type cladding layer, a light emitting layer, a p-type cladding layer, and an n-type semiconductor layer on a substrate;
an n-type current confinement layer formation step of forming an opening with an opening with of A in the n-type semiconductor layer, thereby forming an n-type current confinement layer such that a part of the p-type cladding layer is exposed;
a p-type contact layer formation step of forming a p-type contact layer on an exposed surface of the p-type cladding layer and on the n-type current confinement layer;
a mask formation step of forming a mask that is concentric with the opening and has a mask width of B on the p-type contact layer;
a hydrogen ion implanting step of implanting hydrogen ions through a surface of the p-type contact layer, thereby forming a hydrogen ion implanted area extending from the p-type contact layer to the light emitting layer in the thickness direction; and
a p-type electrode formation step of removing the mask and then forming, on the p-type contact layer, a p-type electrode that is concentric with the opening and has a light emission window with a window opening width C equal to or larger than the opening width A of the opening and smaller than the mask width B.

5. The method of producing a point source light-emitting diode, according to claim 4, wherein a hydrogen ion dose in the hydrogen ion implanting step is $1.0 \times 10^{13}$ atoms/cm$^2$ or more.

6. The method of producing a point source light-emitting diode, according to claim 5, wherein the hydrogen ion dose in the hydrogen ion implanting step is $2.0 \times 10^{15}$ atoms/cm$^2$ or less.

* * * * *